United States Patent [19]

Lee

[11] Patent Number: 4,863,548

[45] Date of Patent: Sep. 5, 1989

[54] TEST PATTERN FOR USE MONITORING VARIATIONS OF CRITICAL DIMENSIONS OF PATTERNS DURING FABRICATION OF SEMICONDUCTOR DEVICES

[75] Inventor: Won-Sik Lee, Seoul, Rep. of Korea

[73] Assignee: SamSung Electronics Co., Ltd., Suweon, Rep. of Korea

[21] Appl. No.: 170,428

[22] Filed: Mar. 18, 1988

[30] Foreign Application Priority Data

Mar. 21, 1987 [KR] Rep. of Korea ............... 1987-2613

[51] Int. Cl.$^4$ ............... H01L 21/306; H01L 21/205; B44C 1/22; B05D 3/06

[52] U.S. Cl. ............................ 156/345; 156/626; 156/659.1

[58] Field of Search ............ 156/626, 657, 345, 659.1, 156/662; 427/8, 9

[56] References Cited

U.S. PATENT DOCUMENTS

| | | | |
|---|---|---|---|
| 4,141,780 | 2/1979 | Kleinknecht et al. | 156/626 |
| 4,650,744 | 3/1987 | Amano | 430/313 |

FOREIGN PATENT DOCUMENTS

| | | | |
|---|---|---|---|
| 57-40934 | 3/1982 | Japan | 156/626 |
| 57-56934 | 4/1982 | Japan | 156/626 |
| 0180027 | 10/1983 | Japan | 156/626 |
| 59-51539 | 3/1984 | Japan | 156/626 |
| 60-86832 | 5/1985 | Japan | 156/626 |

Primary Examiner—William A. Powell
Attorney, Agent, or Firm—Robert E. Bushnell

[57] ABSTRACT

An improved test pattern for monitoring variations of critical dimensions of patterns produced during the fabrication of semiconductor devices is disclosed. The test pattern which allows the critical dimensions to be easily monitored by a microscope, has a reference pattern including a reference line corresponding to one vertical edge of the reference pattern, said reference pattern formed flatly in a given layer below the present layer, a step shaped first pattern including a plurality of vertical indication step line segments corresponding to each vertical edge of the step and being formed flatly in the present layer, each extending line of said line segments being spaced by an equal horizontal interval and one of said line segments lying in the reference line, and a step shaped second pattern including a plurality of vertical indication step line segments corresponding to vertical edges of the step of the second pattern and being formed in separation from the first pattern in the present layer, each of said line segments of the second pattern being arranged on the extending line of each line segment of the first pattern.

25 Claims, 5 Drawing Sheets

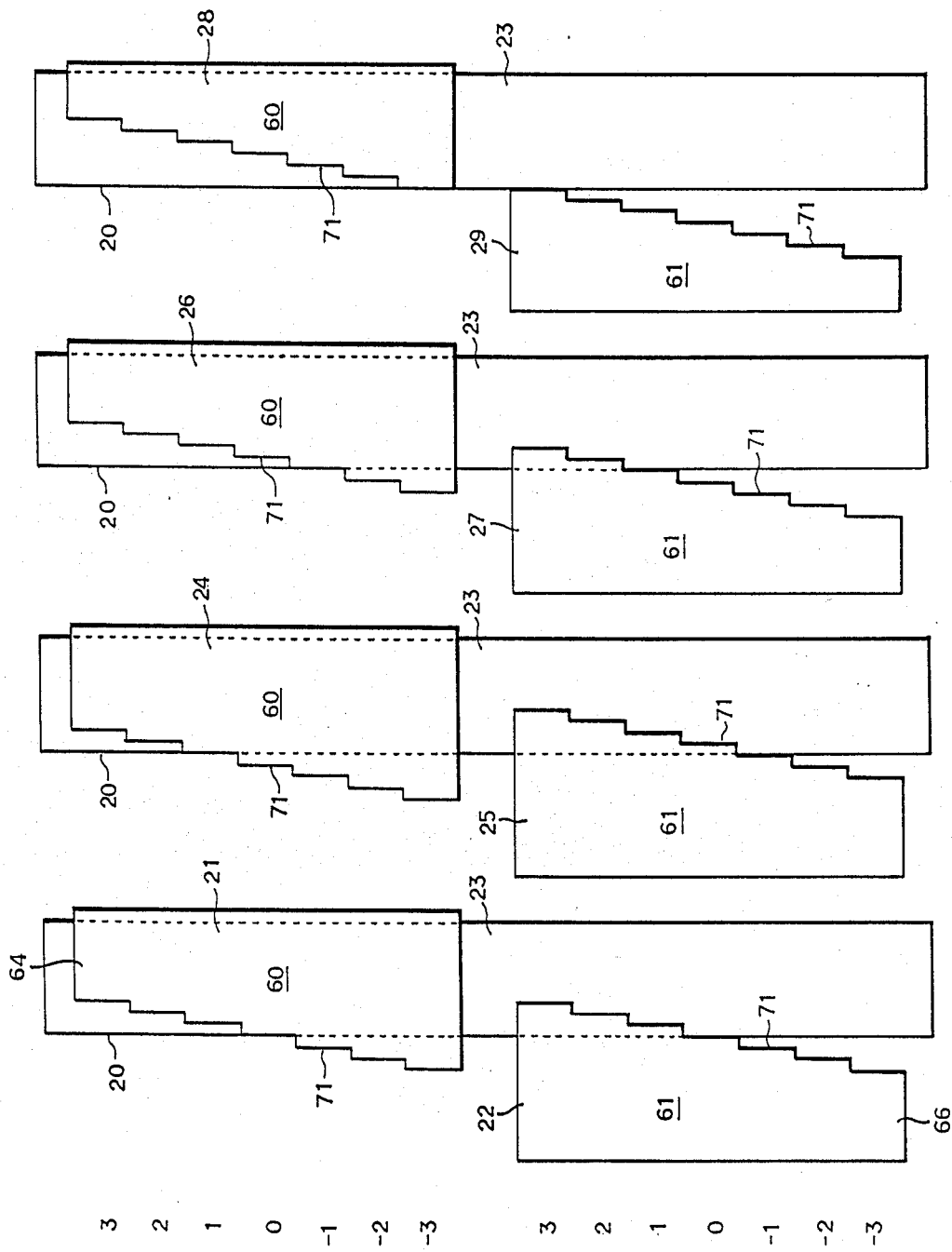

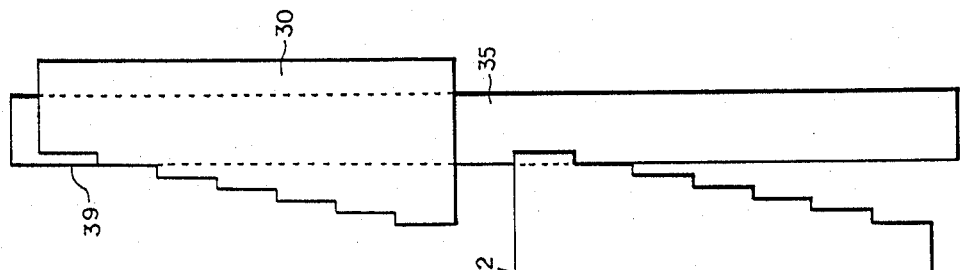
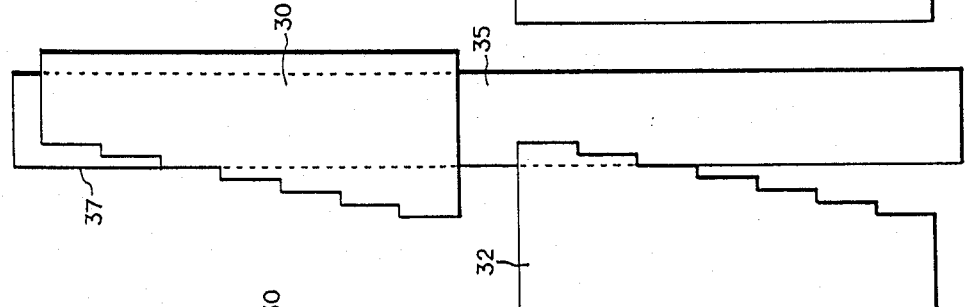
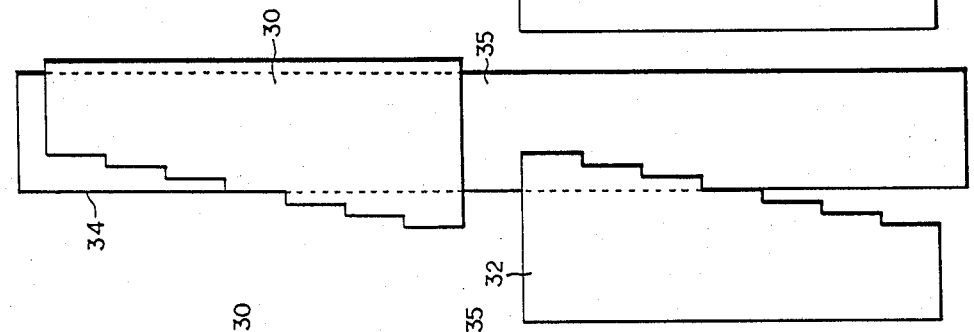
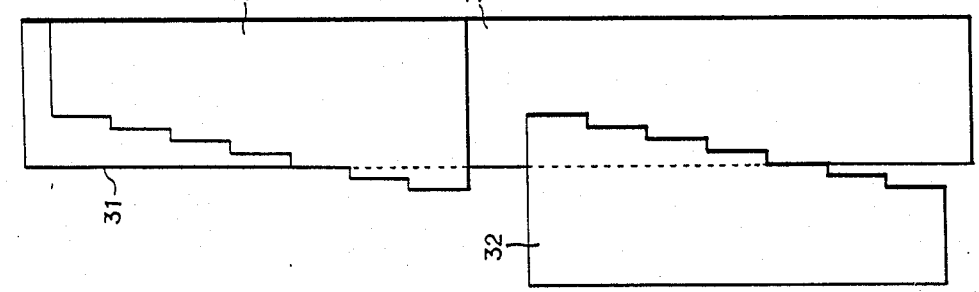

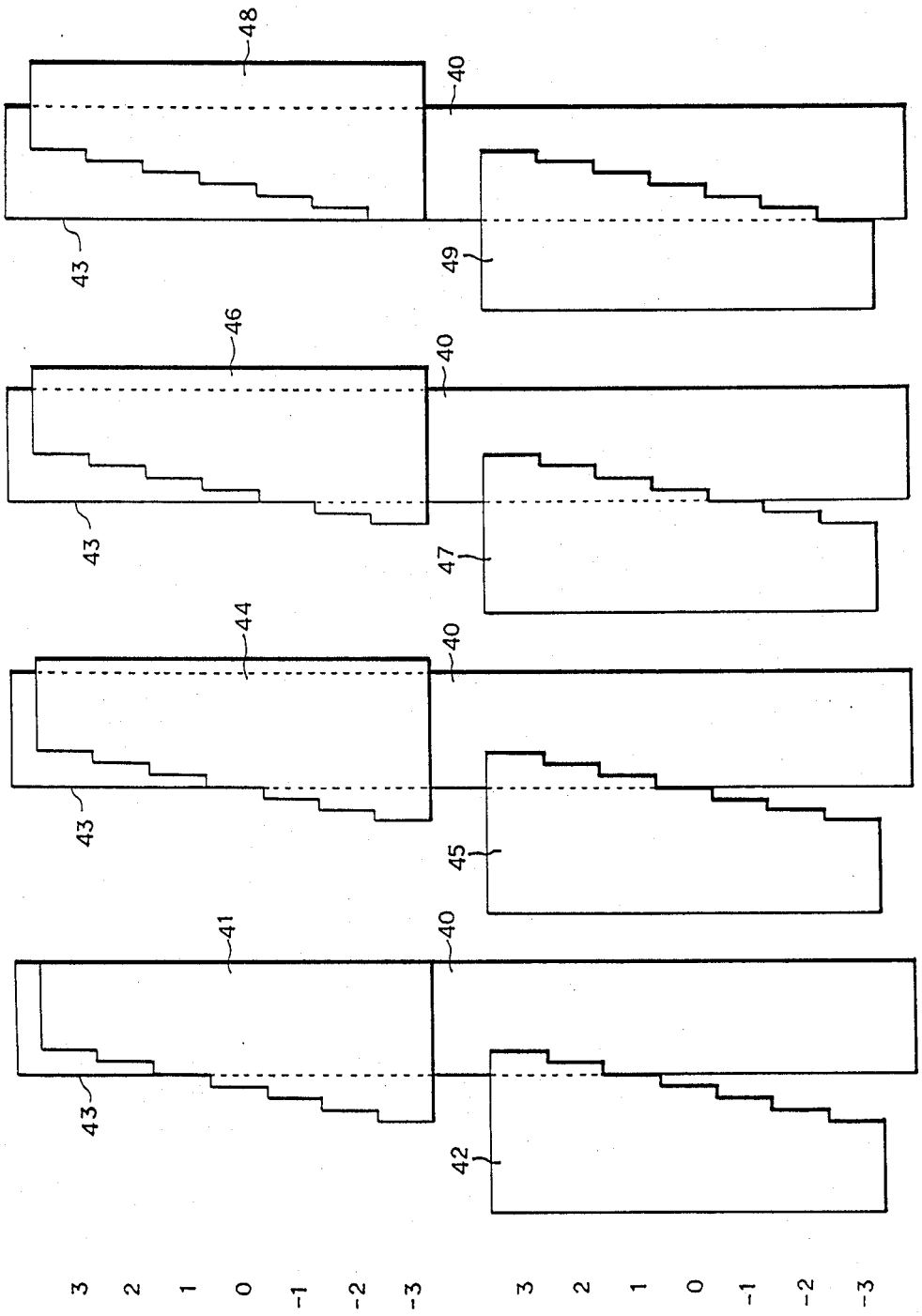

TEST PATTERN FOR USE MONITORING VARIATIONS OF CRITICAL DIMENSIONS OF PATTERNS DURING FABRICATION OF SEMICONDUCTOR DEVICES

BACKGROUND OF THE INVENTION

The present invention relates to a test pattern for monitoring variations of critical dimensions (CDs) of patterns produced during the fabrication of semiconductor devices, and in particular an improved test pattern which allows the critical dimensions to be easily monitored by a microscope.

Conventionally, semiconductor devices have multiple layered structures of 4 to 5 layers or sometimes up to 20 layers on a semiconductor wafer. Each of such layers is produced on the wafer by the process of growing or depositing a silicon oxide, a silicon nitride, a PSG, a BPSG, or the like, and then etched to desired design patterns by the photolithography technology. Therefore, the integration of the layers results in each individual chip on the wafer. However, since dimensions of patterns formed on the wafer greatly affect the operative characteristics of resulting devices such as the yield and speed thereof, the dimensions during the fabrication of semiconductor devices should be controlled as accurately as possible so as to substantially render the dimensions the same as those of their designed patterns.

Therefore, a certain process step requires to measure widths or critical dimensions (CDs) of patterns produced on the same layer during the fabrication of a semiconductor device. However, because it is very inconvenient to respectively measure the dimensions of patterns by using a dimension measuring instrument, a special test pattern to monitor changes of the critical dimensions (hereinafter referred as to "CD bar".) has been employed in scribing regions or regions where any device element patterns are not formed. Moreover, as dimensions on semiconductor devices become smaller, the CD bar becomes a more convenient way to measure changes of CDs because it enables the position of CD bar to be read by using only a microscope. That is, since various patterns formed in the same layer are produced through the same etching and photolithographic method even though each CD of the patterns is different, the variation of the CDs are equally kept up throughout all the patterns. Accordingly, it becomes possible to detect the incremental increase or the decremental decrease of each widths of patterns with the CD bar.

The CD bars as aforementioned are divided into two categories in the art. One of the two is a CD bar to measure the CD by using a special measuring machine and the other is a CD bar having a special pattern to measure the CD only by an eye of observer using a microscope. The former CD bar can serve a precise measurement but makes the measurement itself complicated. The latter CD bar makes the measurement easy though its accuracy falls below. Since the fabrication of semiconductor devices is to form in sequence a plurality of various layers as mentioned above, it is very complicated and time-consuming work to measure each CD by the special machine after each pattern is once formed. Thus, the eye-measurable CD bar using a microscope generally prevails in the art, in which the special patterns of test geometry are disposed in a proper arrangement so that ony dimensions in either horizontal sides or vertical sides thereof are different from one another bythe minimum CD variation value for measurement desired in designing. The use of an eye measurable CD bar makes it easy to monitor the variation of total CDs according to each CD changing in the fabrication of the semiconductor device.

Referring to FIG. 1, rectangular patterns 10 through 17 represent eye-measurable CD bars of currently practiced are showing various changes of CDs. Each horizontal side of upper rectangular patterns 10, 12, 14 and 16 or lower rectangular patterns 11, 13, 15 and 17 has sequentially a length increased by the minimum CD variation value (hereinafter assumed to be 0.1μm). Also, each lower rectangular pattern is positioned at a lower spaced region between the two adjacent spaced upper rectangular patterns. Therefore, the variation of the CD could be detected by reading an indication numeral when both vertical sides of upper and lower rectangular patterns meet in a straight line. FIG. 1A represents a case that there is no change of the CD. One pair of vertical sides of a lower rectangle 11 and a upper rectangle 12 are set in a single straight line at an indication numeral "0", which shows the fact that there is no change of CD. FIG. 1B represents the patterns when the existing CDs decrease in size by 0.2μm, wherein the rectangles of FIG. 1A decrease by 0.1μm in all directions so that their horizontal and vertical sides eventually decrease by 0.2μm in each length. Thus, a pair of vertical sides of a lower rectangle 13' and a upper rectangle 14' are set in single straight line at an indication numer "2", which shows the fact that the CDs decreased by 0.2μm. As aforementioned, FIG. 1C shows that the CDs decreased by 0.3μm and FIG. 1D shows that the CDs increased by 0.1μm. Therefore, it is possible to visibly measure the variations of CDs by each 0.1μm unit. But, because there is no reference line which makes an observer clearly decide whether a pair of vertical sides of an upper-row rectangle and a lower-row rectangle are set in a single straight line or not, there often arises a considerable observation error. To supplement this defect, the shape near the center line of the patterns has changed in a dotted portion shown in FIG. 1A, wherein the correponding corners of the upper and lower rectangular patterns are made so as to be in just contact with each other when the two vertical sides of said rectangular forms are set in a straight line. But it is impossible to keep up therein a sharp cornere angle due to the limitation of photolithographic technology itself in a fabrication process and further difficult to attain a good effect therein because there forms a portion that the etching is not performed between the two corner points.

Referring to FIG. 2 which shows CD bars called Murray Daggers of other currently practiced art, right triangles shaped in steps are illustrated. The size of those incremental steps is assumed to be 0.1μm. Therefore, whenever the CD decremental decrease of patterns produced on the wafer is 0.1μm, the tip step of the triangles disappears one by one. The resulting tip end thereof indicates some marks or numerals next to the triangle so that the CD variation can be monitored. Therefore, by reading those indications, it is possible to measure the CD decreasing widths. Referring to FIG. 2A, the decremental decrease of the CD variation is illustrated to be within 0.1μm. FIG. 2B shows a case which that of the CD variation is between 0.1 to 0.2μm. FIG. 2C shows a case between 0.3 to 0.4μm. The CD bar of Murray Daggers can be employed in case CDs decrease, but it can not be used in case CDs increase. The reason is that though the width of incremental increase of the tip step changes, it gives no changes in length as shown in FIG. 2D.

The measuring capability of Murray Daggers is tied to the photographic technology itself. However, photographic technologies in currently wide use make it difficult to produce accurate photo mask patterns below 0.5μm. Therefore, the CD bar of Murray Daggers makes it useful only when widths of the tip step, that is, the minimum CD variation value in designing are above 0.5μm.

SUMMARY OF THE INVENTION.

Accordingly, it is an object of the present invention to provide an improved test pattern (CD bar) which can easily monitor both the increase and the decrease of CD variations of patterns in the present layer by using only a microscope.

It is a further object of the present invention to provide an improved test pattern which not only can make measurements of the CD variations with the minimum CD variation value in designing but also can be easily formed during the fabrication process.

Accordingly, to achieve these and other objects of the invention, the test pattern for detecting critical dimension variations of patterns in a present layer formed on a semiconductor wafer during the present fabrication processing step comprises a reference pattern including a reference line corresponding to one vertical edge of the reference pattern, said reference pattern formed flatly in a given layer below the present layer, a step shaped first pattern including a plurality of vertical indication step line segments corresponding to each vertical edge of the step and being formed flatly in the present layer, each extending line of said line segments being spaced by an equal horizontal interval and one of said line segments lying in the reference line, and a step shaped second pattern including a plurality of vertical indication step line segments corresponding to vertical edges of the step of the second pattern and being formed in separation from the first pattern in the present layer, each of said line segments of the second pattern being arranged on the extending line of each line segment of the first pattern.

BRIEF DESCRIPTION OF THE DRAWINGS

The features and advantages according to the invention will be now explained hereinafter with reference to the accompanying drawings in which:

FIGS. 3A-3D illustrates an embodiment of CD bars according to the invention wherein there are no mask alignment shifts of patterns in the substrate layer and the present layer and no CD variations of patterns in the substrate layer;

FIGS. 4A-4D illustrates an embodiment of CD bars according to the invention wherein there are no mask alignment shifts of patterns in the substrate layer and the present layer, but there are some CD variation of patterns in the substrate layer; and FIGS. 5A-5D illustrates an embodiment of CD bars according to the invention wherein there are no CD variations of patterns in the substrate layer and the present layer, but there are mask alignment errors thereof.

DETAILED DESCRIPTION OF THE PREFERRED EMBODIMENT

Figure 1B:
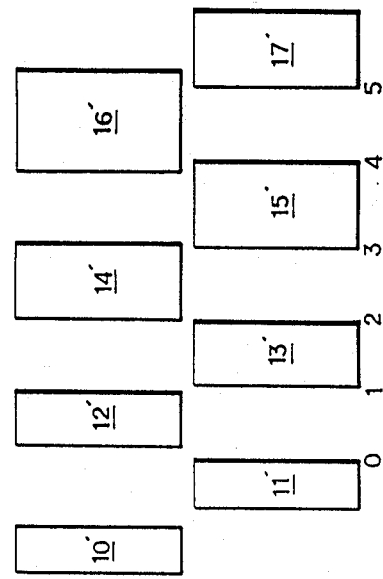
FIGS. 1A-1D illustrates a schematic diagram of eye measurable CD bars having a simple structure according to the currently practiced art.
Figure 1D:
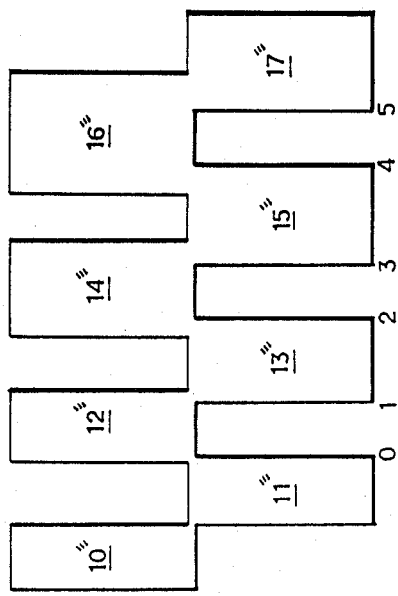
Figure 1A:
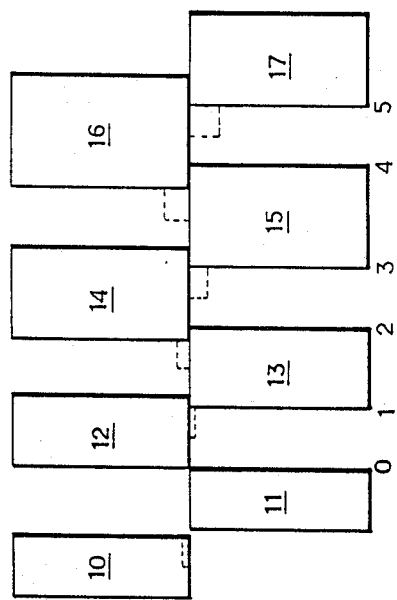
Figure 1C:
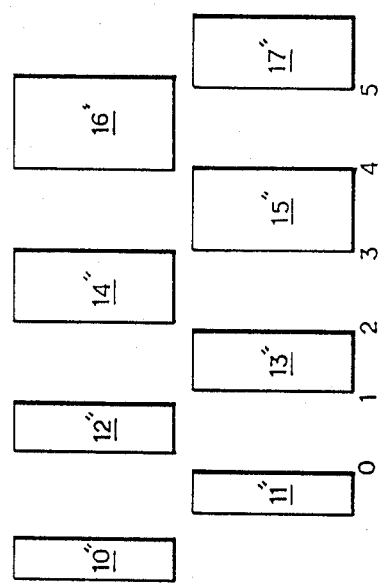
Figure 2D:
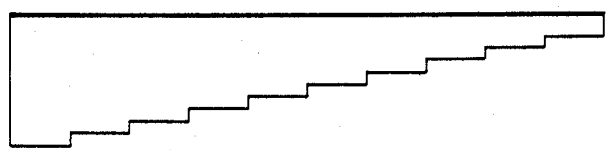
FIGS. 2A-2D illustrates a schematic diagram of eye measurable CD bars of Murray Daggers according to other currently practiced art.
Figure 2C:
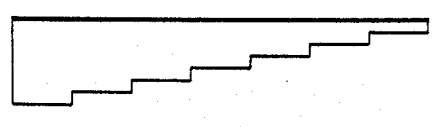
Figure 2B:
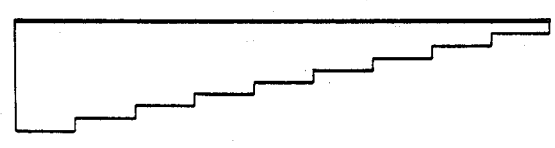
Figure 2A:
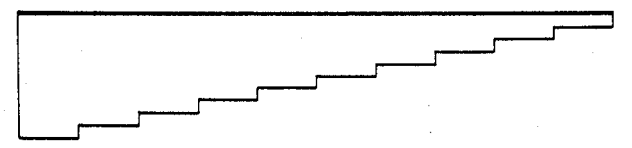

Referring to FIG. 3, a reference pattern 23 which was produced in the layer formed on a semiconductor wafer during the previous processing step (hereinafter will be referred to "the substrate layer") includes a reference line 20 which becomes one edge of the pattern 23. One pair of CD bars 60 and 61 which are formed in the layer produced during the present processing step (hereinafter will be referred to "the present layer") are respectively similar to the shape of Murrary Daggers, but widths of bottom steps 64 and 66 thereof are wider than those of the tip step of Murray Daggers that current photolithographic technologies make it easy to be suitably applied. According to the preferred embodiment of the present invention, each width of the bottom steps 64 and 66 in the present layer is preferred to be at least above 0.5μm. Both the upper CD bar 60 and the lower CD bar 61 include a plurality of indication step line segments 71 which become their vertical edges. Each indication step line segment of the layer CD bar 61 lies in the extending line of each indication step line segment of the upper CD bar 60 and each extending line is horizontally spaced with the same interval, i.e., the minimum CD variation value in design (It will be assumed to be 0.1μm). The reference line 20 arranged between the indication step line segment of the bottom step and that of the top step. Also, the upper and lower CD bars 60 and 61 are disposed with a symmetrical arrangement with respect to a certain point on the reference line 20. Next to each indication step line segment are printed a set of CD bar values which can represent CD variations of patterns in the present layer. If we assume that patterns formed in the present layer are protrudent patterns having widths increased by the development of photoresist or by the photolithograhic technology, the upper CD bar 60 will indicate the positive CD bar value while the lower CD bar 61 the negative CD bar value. It should be noted that the reference pattern 23 formed in the substrate layer and CD bars 60 and 61 in the present layer could be produced in scribing regions or in regions not used as pattern area of electrical elements by the photolithographic technology as mentioned above.

Also, FIG. 3 shows an embodiment of a case in which there are no mask alignment shifts of patterns in the substrate layer and the present layer, and there are no CD variations of patterns in the substrate layer but some CD variations of patterns in the present layer.

FIG. 3A illustrates an instance that there are CD variations of patterns produced in the present layer. Both indication step line segments corresponding to the CD bar values "0" in the upper and lower CD bars 21 and 22 coincide with the reference line 20. Therefore, the difference between the CD bar value in the upper CD bar 21 and that in the lower CD bar 22 is zero. It means that there are no CD variations of patterns in the present layer.

FIG. 3B shows a case that CDs of patterns in the present layer increased with the incremental increase 0.2μm. Indication step line segments on the reference line 20 indicate the CD bar value "1" of upper CD bar 24 and the CD bar value "−1" of lower CD bar 25 respectively. Therefore, the difference between the former value and the latter one is "+2". As a result, it can be found out that CD variations of patterns in the present layer increased by 0.2μm.

FIG. 3C illustrates a situation that CDs of patterns in the present layer decreased with the decremental decrease of 0.2μm. Indication step line segments which lie on the reference line 20 point out the CD bar value "−1" of upper CD bar 26 and "1" of lower CD bar 27 respectively. Since the difference between the value "−1" and "1" is "−2", it can be detected that CD variations of patterns in the present layer decreased by 0.2μm.

Referring to FIG. 3D, it can be understood that the CD variations decreased by 0.6μm in the same manner as mentioned above.

FIG. 4 shows an embodiment of a case in which there are no mask alignment shifts in both the substrate layer and the present layer and no CD variations of patterns produced in the present layer, but there ar some CD variations of patterns produced in the substrate layer.

FIG. 4A illustrates a case that CDs of the reference pattern 33 in the substrate layer increased with the incremental increase of 0.2μm. An indication step line segment in the upper CD bar 30 which lies in the reference line 31 indicates the CD value "−1" while that in the lower CD bar 32 points out the CD value "−1". Thus, since the difference between the two values is zero, there are no CD variations of patterns in the present layer.

FIG. 4B shows a case that there are no CD variations of patterns in the substrate layer, which is like the case of FIG. 3A. Therefore, in this case, there are no CD variations of patterns in the present layer in the same manner as mentioned above.

FIG. 4C illustrates a situation that CDs of patterns in the substrate layer decreased with the decremental decrease of 0.2μm. Indication step line segments on the reference line 37 indicate all the same CD value "1" of the upper CD bar 30 and the lower CD bar 32. Therefore, since the difference between the two values is zero, there are no CD variations of patterns in the present layer.

FIG. 4D illustrates a case that CDs of patterns in the substrate layer decreased with the decremental decrease of 0.4μm. In the same manner as mentioned above, since there is no difference between the two CD bar values (i.e. "2" and "2"), there are no CD variations in the present layer patterns.

As described above referring to FIG. 4A through FIG. 4D, even though reference line varied due to CD variations in the substrate layer, there would be always no difference between the CD value of the upper CD bar and that of the lower CD bar when there were no CD variations in the present layer. Therefore, an observer can easily measure CD variation values in the present layer without knowledge of CD variations in the substrate layer reading CD values of both upper CD bar and lower CD bar.

FIG. 5 shows an embodiment of a case in which there are no CD variations in both the substrate layer and the present layer, but some mask alignment error arises during the patterning process of the substrate layer and the present layer.

FIG. 5A illustrates a case that the resulting mask alignment error was 0.1μm by the right side movement of mask pattern of the substrate layer or 0.1μm by the left side movement of mask pattern of the present layer. In this case, both CD bar values of the upper CD bar 41 and the lower CD bar 42 are all "1".

FIG. 5B shows a situation that there was no resulting mask alignment shift by moving both mask patterns of the substrate layer and the present layer by the same amount to the same direction. Therefore, both CD bar values of the upper CD bar 44 and the lower CD bar 45 are all "0".

FIG. 5C shows a case that the mask alignment error was 0.1μm toward the right side. Therefore, both CD bar values of the upper CD bar 46 and the lower CD bar 47 are all "−1".

FIG. 5D illustrates a case that the mask alignment error was 0.3μm toward the right side. Therefore, both CD bar values of the upper CD bar 48 and the lower CD bar 49 are all "−3". Every case of FIG. 5A through FIG. 5D gives a description of no CD variations of patterns in the present layer, since there is no difference between both CD values.

As described above, the CD variation value, ΔCD, can be written as follows:

$$\Delta CD = (XCD - YCD) \cdot MS,$$

wherein XCD is the CD value of the upper CD bar, YCD is the CD value of the lower CD bar and MS is the minimum critical dimension variation value in design.

In protrudent shapes of patterns in the present layer, the increase of CDs in the present layer will represent the positive sign of the CD variation value while the decrease of CDs in the present layer will represent the negative sign thereof. However, in recess or concave shapes of patterns in the present layer, the fact will represent to the contrary. That is, the increase of CDs in the present layer will give the negative sign of the CD variation value while the decrease of CDs in the present layer will give the negative sign thereof.

Generally, photolithographic technologies during the fabrication of semiconductor devices have a feature that CD variation values can substantially change depending on the dimensions from adjacent patterns and th density of patterns. Thus, to solve this drawback, patterns of CD bars would be preferred to be formed so as to be sufficiently spaced from neighboring patterns.

As described above, the CD bars according to the present invention have advantages which can easily detect CD variations of patterns in the present layer in spite of CD variations in the substrate layer or mask alignment errors of the present layer and the substrate layer.

While the aforementioned embodiment has been explained in a case that the upper CD bar and the lower CD bar are arranged in symmtry to a certain point with each other, it will be well understood by those skilled in the art in a case that they are made to be symmetrical to a line. In addition, in a case that the layer CD bar is arranged in relation being moved in parallel from the upper CD bar, the sign of CD bar values in the lower CD bar may be made to the contrary. Therefore, while the invention has been particularly shown and described with reference to a preferred embodiment, it will be well understood by those skilled in the art that modification in detail may be made without departing from the spirit and scope of the invention.

What is claimed is:

1. A test pattern for detecting critical dimension variations of patterns in an outer layer formed on a semiconductor wafer in a fabrication processing step, comprising:

a reference pattern including a reference line corresponding to one vertical edge of the reference pattern, said reference pattern formed flatly in a lower layer below the outer layer;

a step shaped first pattern including a first plurality of vertical indication step line segments corresponding to each vertical edge of the step shaped first pattern and being formed flatly in the outer layer, each extension of said line first plurality of step line segments being in an equal horizontal interval and one of said line segments lying the reference line so as to enable detection of a first critical dimension value; and a step shaped second pattern including a second plurality of vertical indication step line segments corresponding to vertical edged of the step shaped second pattern and being formed in separation from the first pattern in the outer layer, each of said second plurality of line segments of the second pattern being arranged on the extension of each line segment of the first pattern and one of said line segments of the second pattern lying in the reference line so as to detect a second critical dimension value.

2. A test pattern according to claim 1 further comprising a set of numerals and symbols patterned for determining the values of variations in critical dimensions of patterns in the outer layer next to the line segments.

3. A test pattern according to claim 2 wherein each of the first pattern and the second pattern is a step shaped right triangle having a tip step with a width substantially above $0.5\mu m$.

4. A test pattern according to claim 3 wherein the horizontal interval represents a minimum critical dimension variation value in design.

5. A test pattern according to claim 4 wherein the value of critical dimension variations of patterns in the outer layer is determined by the minimum critical dimension variation value multiplied by the difference between the first critical dimension value and the second critical dimension value.

6. A test pattern according to claim 1, wherein the horizontal interval is a minimum critical dimension variation value.

7. A test pattern according to claim 6, wherein the value of critical dimension variations of patterns in the outer layer is determined by the minimum critical dimension variation value multiplied by the difference between the first critical dimension value and the second critical dimension value.

8. A test pattern for detecting variations among patterns, comprising:

a reference pattern formed as a lower plane with one edge of the reference pattern lying in the lower plane defining a reference line;

a first pattern formed as an upper plane with a first side of said first pattern formed as a first series of steps, extensions of segments of said first series of steps being equi-distantly spaced apart with one of said segments of said first series of steps lyig on said reference line; and a second pattern spaced apart from said first pattern, with a second side of said first pattern formed as a second series of steps, segments of said second series of steps being equi-distantly spaced apart with one of said segments of said second series of steps lying on said reference line.

9. The test pattern of claim 8, further comprising said segments of said first series of steps and second series of steps being mutually parallel.

10. The test pattern of claim 8, further comprising said first side and said second side lying along oppositely facing edges of said first and second patterns, respectively.

11. The test pattern of claim 9, further comprising said first side and said second side lying along oppositely facing edges of said first and second patterns, respectively.

12. The test pattern of claim 8, further comprising said first and second patterns lying in the same upper plane.

13. The test pattern of claim 8, further comprising said first and second patterns being disposed in a symmetric arrangement with respect to a point on said reference line.

14. The test pattern of claim 9, further comprising said first and second patterns being disposed in a symmetric arrangement with respect to a point on said reference line.

15. The test pattern of claim 8, further comprising symbolic means disposed on the upper plane next to corresponding ones of said first and second patterns, for determining values of variations in critical dimensions of patterns disposed in th upper plane.

16. The test pattern of claim 9, further comprising symbolic means disposed on the upper plane next to corresponding ones of said first and second patterns, for determining values of variations in critical dimensions of patterns disposed in the upper lane.

17. A test pattern for detecting variations among patterns, comprising:

a reference line lying in a first plane;

a first pattern disposed in a second plane and having a first side providing a series of steps defining a first series of line segments offset by incremental dimensions; and a second pattern spaced apart from said first pattern and having a second side providing a series of steps defining a second series of line segments offset by incremental dimensions;

said first and second series of line segments being generally parallel to sid reference line.

18. The test pattern of claim 17, further comprising said incremental dimensions being equal.

19. The test pattern of claim 17, further comprising each of said second series of line segments lying on extensions of different ones of said first series of line segments.

20. The test pattern of claim 18, further comprising each of said second series of line segments lying on extensions of different ones of said first series of line segments.

21. The test pattern of claim 20, further comprising said first and second patterns being disposed in a symmetrical arrangement with respect to a point on said reference line.

22. The test pattern of claim 17, further comprising said first side and said second side lying along oppositely facing edges of said first and second patterns, respectively.

23. The test pattern of claim 18, further comprising said first side and said second side lying along oppositely facing edges of said first and second patterns, respectively.

24. The test pattern of claim 17, further comprised of said first and second patterns lying in the same upper plane.

25. The test pattern of claim 18, further comprising said first and second patterns lying in the same upper plane.

* * * * *